US011076356B2

(12) United States Patent
Nema et al.

(10) Patent No.: US 11,076,356 B2
(45) Date of Patent: Jul. 27, 2021

(54) CELLULAR MODEM WITH DYNAMIC LOW BATTERY VOLTAGE THRESHOLD CONTROL

(71) Applicant: HONEYWELL INTERNATIONAL INC., Morris Plains, NJ (US)

(72) Inventors: Priyesh Nema, Telangana (IN); Jayakar Chippada, Telangana (IN); Krishna Kishore Mendi, Telangana (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/750,073

(22) Filed: Jan. 23, 2020

(65) Prior Publication Data

US 2020/0275378 A1    Aug. 27, 2020

Related U.S. Application Data

(60) Provisional application No. 62/809,784, filed on Feb. 25, 2019.

(51) Int. Cl.
| | |
|---|---|
| *H04W 52/02* | (2009.01) |
| *G01R 19/165* | (2006.01) |
| *G01R 19/00* | (2006.01) |
| *G01R 31/3835* | (2019.01) |

(52) U.S. Cl.
CPC .... *H04W 52/0277* (2013.01); *G01R 19/0038* (2013.01); *G01R 19/16542* (2013.01); *G01R 19/16576* (2013.01); *G01R 31/3835* (2019.01)

(58) Field of Classification Search
CPC ......... H04W 52/0277; G01R 19/06542; G01R 19/0038; G01R 19/16576; G01R 31/3835
USPC ........................................................ 455/574
See application file for complete search history.

(56) References Cited

U.S. PATENT DOCUMENTS

| | | | |
|---|---|---|---|
| 7,027,773 B1 * | 4/2006 | McMillin | H04L 45/00 455/41.2 |
| 8,131,316 B2 | 3/2012 | Vaglica et al. | |
| 2011/0194353 A1 * | 8/2011 | Hwang | G11C 16/12 365/185.19 |
| 2018/0134176 A1 * | 5/2018 | Symanow | B60L 11/1868 |
| 2019/0212997 A1 * | 7/2019 | Sangameswaran | B60L 58/13 |

* cited by examiner

*Primary Examiner* — Eugene Yun
(74) *Attorney, Agent, or Firm* — Jetter & Associates, P.A.; Neil R. Jetter

(57) ABSTRACT

An industrial cellular modem includes a radio module powered by a battery, a battery voltage sensor, a transmitted power meter, and a temperature sensor, and a processor having a memory for executing program instructions for a method of dynamic low battery voltage threshold (LBVT) control. A current battery voltage is compared to a current LBVT (CLBVT), and the modem is turned on and a cellular data session begun with a host server if the current voltage is ≥ the CLBVT, or if the current battery voltage is < the CLBVT and a value of the CLBVT is the same as in a previous cellular data session. Based on whether the current cellular session failed due to the battery voltage falling below the CLBVT, the value of the CLBVT is changed based on a current temperature, a received signal strength for a successful session, or a current transmit power.

14 Claims, 2 Drawing Sheets

CELLULAR MODEM WITH DYNAMIC LOW BATTERY VOLTAGE THRESHOLD CONTROL

CROSS REFERENCE TO RELATED APPLICATIONS

This application claims the benefit of Provisional Application Ser. No. 62/809,784 entitled "INDUSTRIAL CELLULAR MODEM WITH DYNAMIC LOW BATTERY VOLTAGE THRESHOLD CONTROL," filed Feb. 25, 2019, which is herein incorporated by reference in its entirety.

FIELD

Disclosed embodiments relate to a cellular modem, more particularly to low battery voltage monitoring of the battery of the cellular modem.

BACKGROUND

A cellular modem is known to be used with supervisory control and data acquisition (SCADA) systems to improve productivity, increase a plant's uptime and prevent equipment damage. SCADA refers to an industrial control systems (ICS) used to control infrastructure processes (water treatment, wastewater treatment, gas pipelines, wind farms, etc.), facility-based processes (airports, space stations, ships, etc.,) or industrial processes (production, manufacturing, refining, power generation, etc.).

The cellular modem is similar to a cellular phone, with the main difference being the cellular modem has no keypad or screen, or rechargeable batteries, and in operation the cellular modem is affixed and thus is not mobile, such as being enclosed inside a gas meter, or more generally any smart meter. In the case of application within a hazardous location, the cellular modem is generally placed inside an explosion proof casing.

There are several types of cellular modems, that generally operate with one of the following communication protocols comprising Global System for Mobile communications (GSM), Code Division Multiple Access (CDMA), or Long Term Evolution (LTE). Cellular modems can be used by their users for data communication and text messaging (Short Message Service (SMS)) including sending and receiving text messages. Cellular modems generally have an internet protocol (IP) address similar to a cell phone. In industrial networking applications, cellular modems use an industrial intermediary device that is generally a central server, such as an inter-process communication (IPC) server, embedded computer, or programmable logic controller (PLC), in order for the cellular modem to wirelessly connect to serial data devices such as field devices (e.g., sensors, actuators, valves or gas regulators) to a cellular network.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes for battery powered cellular industrial modems used in hazardous environments or in remote locations, low battery voltage threshold identification can be an important parameter. This is because below this low battery voltage threshold the modem stops communications with its host server, and does not come back up to service until its battery is generally replaced. The battery parameters can also vary significantly based on ambient weather conditions including principally the temperature.

This Disclosure also recognizes the conventional fixed low battery voltage threshold (LBVT) value used for an industrial cellular modem can instead be dynamically adjusted such that it variably consumes the battery power to its drop point (LVT value), which cannot be achieved by a conventional single LBVT value due to its variation with parameters such as the temperature.

One disclosed arrangement comprises an industrial cellular modem, including a radio module powered by a battery that is coupled to an antenna, a processor having an associated memory, and a battery voltage sensor coupled for sensing a voltage across the terminals of the battery. There may also be two antennas, one for transmit and one for receive. There is also a transmitted power meter and a temperature sensor. The memory includes program instructions executable by the processor for executing a method of dynamic LBVT control. The method includes reading a current battery voltage for the battery, and comparing the current battery voltage to a current LBVT (CLBVT) to determine whether or not the current battery voltage is greater than the CLBVT.

The industrial cellular modem is turned on and a current cellular data session with a host server is begun if the current battery voltage is greater than or equal to ($\geq$) the CLBVT, or the current battery voltage is less than ($<$) the CLBVT and a value of the CLBVT is the same as at least one previous cellular data session with the host server. Based on whether the current cellular data session failed due to the battery voltage falling below the CLBVT, the value of the CLBVT is increased or decreased based on at least one selected parameter. The selected parameters comprise (i) a current temperature sensed by the temperature sensor, (ii) a received signal strength for at least one recent successful data session with the host server, and (iii) a current transmit power of the radio module from the transmitted power meter.

DETAILED DESCRIPTION

Figure 1:
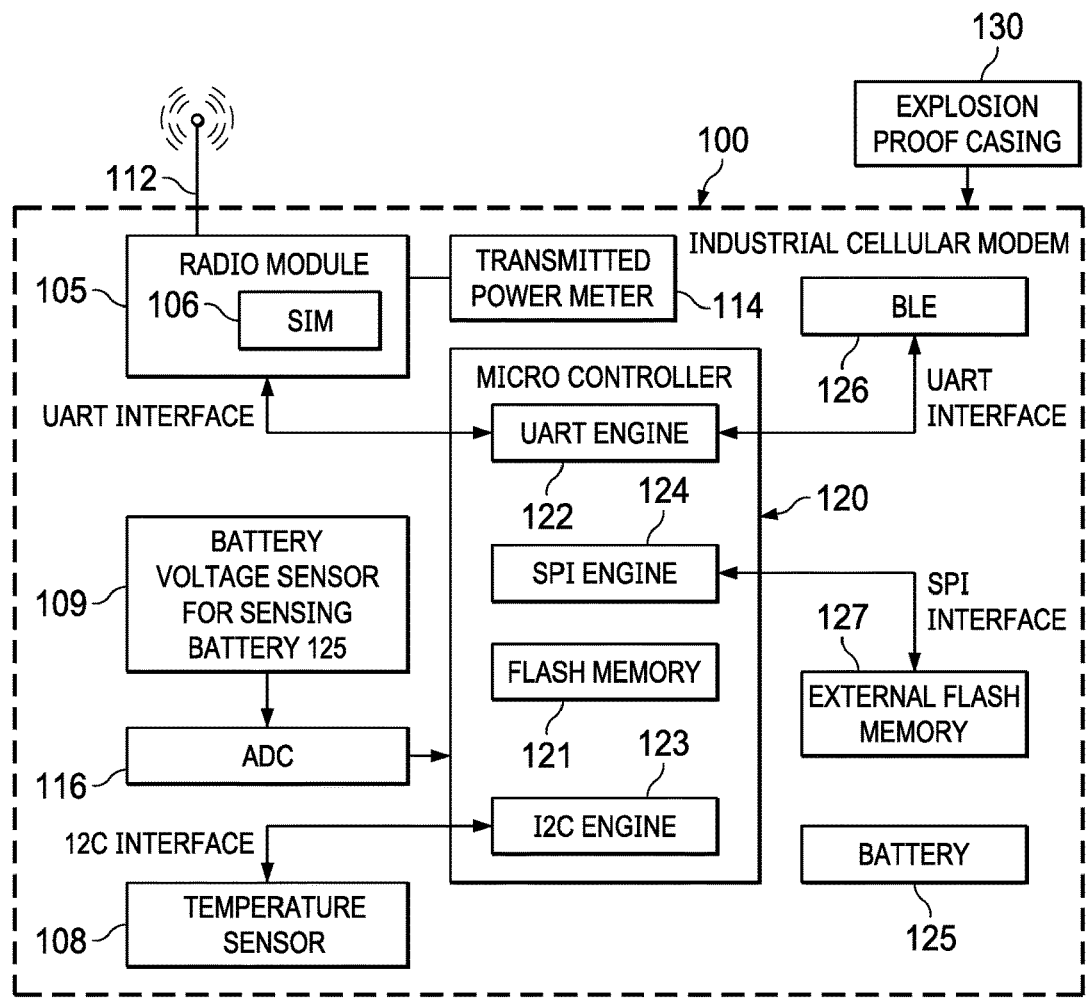
FIG. 1 is block diagram depiction of an example industrial cellular modem having an antenna that can benefit from disclosed aspects including a battery, a battery voltage sensor, and a processor implementing disclosed dynamic LBVT value setting, according to an example embodiment.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Disclosed aspects include a cellular industrial modem configured (e.g., having a memory associated with the processor programmed to implement an algorithm) to dynamically vary its LBVT value responsive to certain conditions, where in contrast conventional cellular industrial modems always use a fixed LBVT value. The LBVT value can be varied based on the call results from the cellular industrial modem to its host server, such as the success or failure of at least one call to its host server, or the amount of data that was transferred during a communication such as a call or a text from the cellular industrial modem to the host server.

For example, if the current battery voltage is at or below the CLBVT value and a call is initiated from the cellular industrial modem, if the call to the host server was successful as evidenced by an acknowledgment received from the host server, the LBVT value can be automatically reduced by some known value (e.g., an example known reduction value being 0.2V, thus from 2.8V to 2.6V). However, if the call to its host server failed, the LBVT value can be increased by some known value. The benefits of disclosed LBVT adjustment (either an increase or decrease) includes decreasing the call failure rate for the cellular industrial modem as compared to when operating the cellular industrial modem with a conventional fixed LBVT value.

The CLBVT value will be applicable, meaning the algorithm will be active and the battery voltage will be monitored and the CLBVT value adjusted based on certain conditions by a disclosed algorithm, if at least one call to the host server (e.g., 2 or 3 calls) by the industrial cellular modem failed at the same CLBVT value. For example, if the previous three calls from the industrial cellular modem to the host server failed at the same CLBVT value, the algorithm will be activated and the fourth call will not be tried till the battery voltage increases above the LBVT value, that is generally accomplished by changing the battery. The industrial cellular modem's LBVT value thus adapts to the variation in battery parameters from ambient temperature conditions and in some cases some other condition (s) such as the humidity.

FIG. 1 is block diagram depiction of an example industrial cellular modem 100 that can benefit from disclosed dynamic LBVT control. The industrial cellular modem 100 includes a radio module 105 (a transmitter and a receiver, or a transceiver) shown having a subscriber identification module (SIM) card 106 that is coupled to an antenna 112, a battery 125, a temperature sensor 108, and a battery voltage sensor 109 coupled to terminals of the battery 125 (this coupling not shown). A transmitted power meter 114 measures to transmitted power currently being utilized by the radio module 105.

The industrial cellular modem 100 is shown including a processor shown as a microcontroller 120 having an associated memory shown as a flash memory 121 for implementing disclosed dynamic low battery voltage threshold value control. The industrial cellular modem 100 is also shown including a Universal Asynchronous Receiver/Transmitter (UART) engine 122, Inter-Integrated Circuit (I2C) engine 123, and Serial Peripheral Interface (SPI) engine 124. The various interfaces used for communications shown in FIG. 1 (UART, I2C and SPI) are all only for example. External flash memory 127 is also provided by the industrial cellular modem 100 to store the modem configuration and historical sensor data. The industrial cellular modem 100 is shown also having a Bluetooth low energy (BLE) communications module 126, where Bluetooth is an example of a known wireless technology standard for exchanging data over short distances (using short-wavelength UHF radio waves in the ISM band from 2.4 to 2.485 GHz) from fixed and mobile devices, and building personal area networks (PANs).

The radio module 106 is shown communicating with the UART engine 122 over a UART interface. The SPI engine 124 is shown communicating over an SPI interface with the external flash memory 127. The temperature sensor 108 is shown communicating with the IT engine 123 over an I2C interface. The UART engine 122 shown communicating with the BLE communications module 126 over and UART interface. The battery voltage sensor 109 shown coupled to the microcontroller 120 by coupling including an analog-to-digital converter (ADC) 116.

The industrial cellular modem 100 also includes a casing, shown as an explosion proof casing 130. As known in the art, and an explosion proof casing needs to contain any explosion originating within its housing and to prevent sparks from within its housing from igniting vapors, gases, dust, or fibers in the air surrounding it. Industrial cellular modem 100 can be seen to have no keypad or display screen which differentiates it from a conventional cellular modem that generally has both a keypad, a display screen, and no rechargeable batteries.

Figure 2:
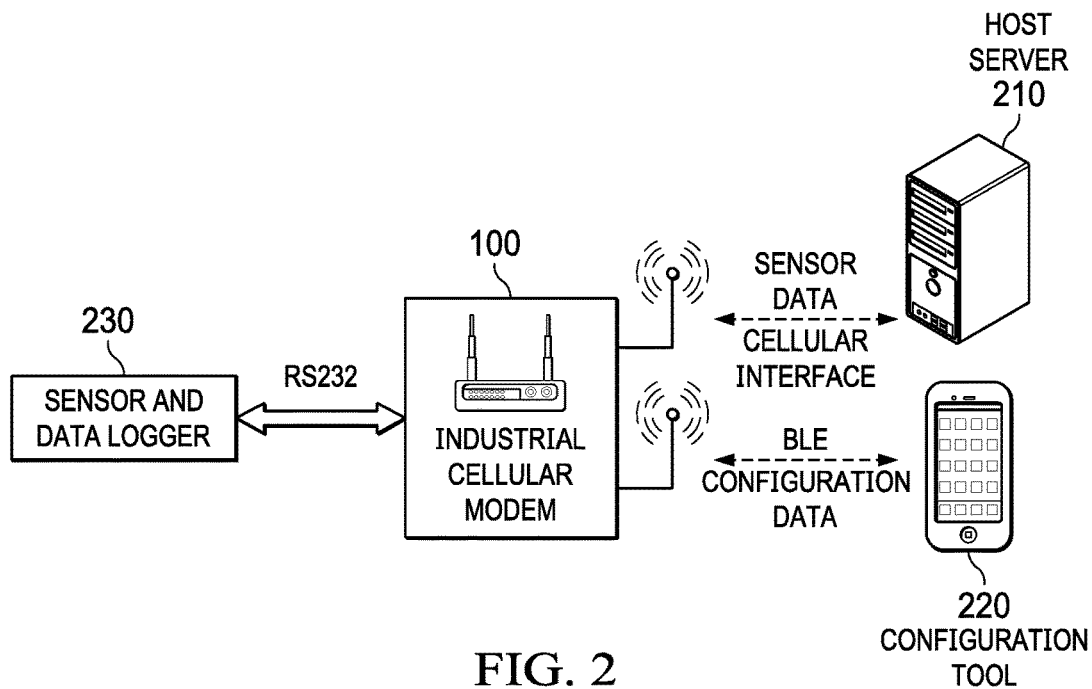
FIG. 2 shows an industrial cellular modem in a SCADA application wirelessly communicating with a host server.

Regarding FIG. 2, the industrial cellular modem 100 is shown in a typical application wirelessly coupled to a host server 210, where sensor data generally including at least a battery voltage reading is shown sent over the cellular interface between the industrial cellular modem 100 and the host server 210 generally in the form of packets. The industrial cellular modem 100 is also shown communicating configuration data using BLE with a wireless configuration tool 220 that can be used to configure the industrial cellular modem 100. The configuration data can be the cellular network's access point name (APN), the industrial cellular modem's ID number, or the serial communications (e.g., RS232) baud rate. The industrial cellular modem 100 is also shown communicating with a sensor and data logger 230 over a serial interface cable utilizing RS232.

The sensor and data logger 230 in the case of a sensor can generally be utilize any sensor, and the sensor and data logger 230 has the capability of sending its data over a serial connection. Typically, these sensors comprise electronic gas volume correctors, installed throughout the intercontinental or intracontinental gas pipelines. The gas volume correctors measure the amount (volume) of gas passing through the pipe, and using temperature and pressure information apply temperature and pressure correction factors, compute the corrected volume of gas passing. This data gets logged in the sensor and data logger 230 itself and at a pre-determined time that is configured in the sensor, and the sensor and data logger 230 sends this data to host server 210 through its radio module.

In SCADA applications where alarm notification and remote control are used, a user may send a text message to the host server 210 using the industrial cellular modem 100 such as a request for information being "Water level in tank 10." Then, generally within a few seconds, the user of the industrial cellular modem 100 receives an acknowledgment packet to the application running on his or her industrial cellular modem 100 that may be "Water level tank 10—12 feet."

Disclosed methods can use the battery 125 of the industrial cellular modem 100 more efficiently, such as by being responsive to changes in the ambient temperature. Disclosed methods will therefore allow industrial cellular modem customers to receive a higher number of calls from the same battery of a conventional industrial cellular modem by the disclosed adjusting of the CLBVT value down if the current battery voltage is at or below the CLBVT value, and when a call is successfully made from the cellular industrial modem 100 to its host server 210.

With disclosed methods, the number of calls from the industrial cellular modem 100 to the host server 210 can be increased by utilizing a configurable CLBVT value rather than relying on a conventional fixed CLBVT value. Moreover, the dependency on dynamics of the battery 125 (such as charging and discharging times, battery sustenance and variation of battery voltage with respect to temperature) is avoided because the battery parameters change significantly from vendor to vendor. A prediction algorithm can also be used to predict and adapt the CLBVT values based on annual historical data, such as data trends. For example, a successful call history for a winter season with a particular LBVT value can enable a disclosed method to choose a LBVT value that is to be used for winter season.

Figure 3:
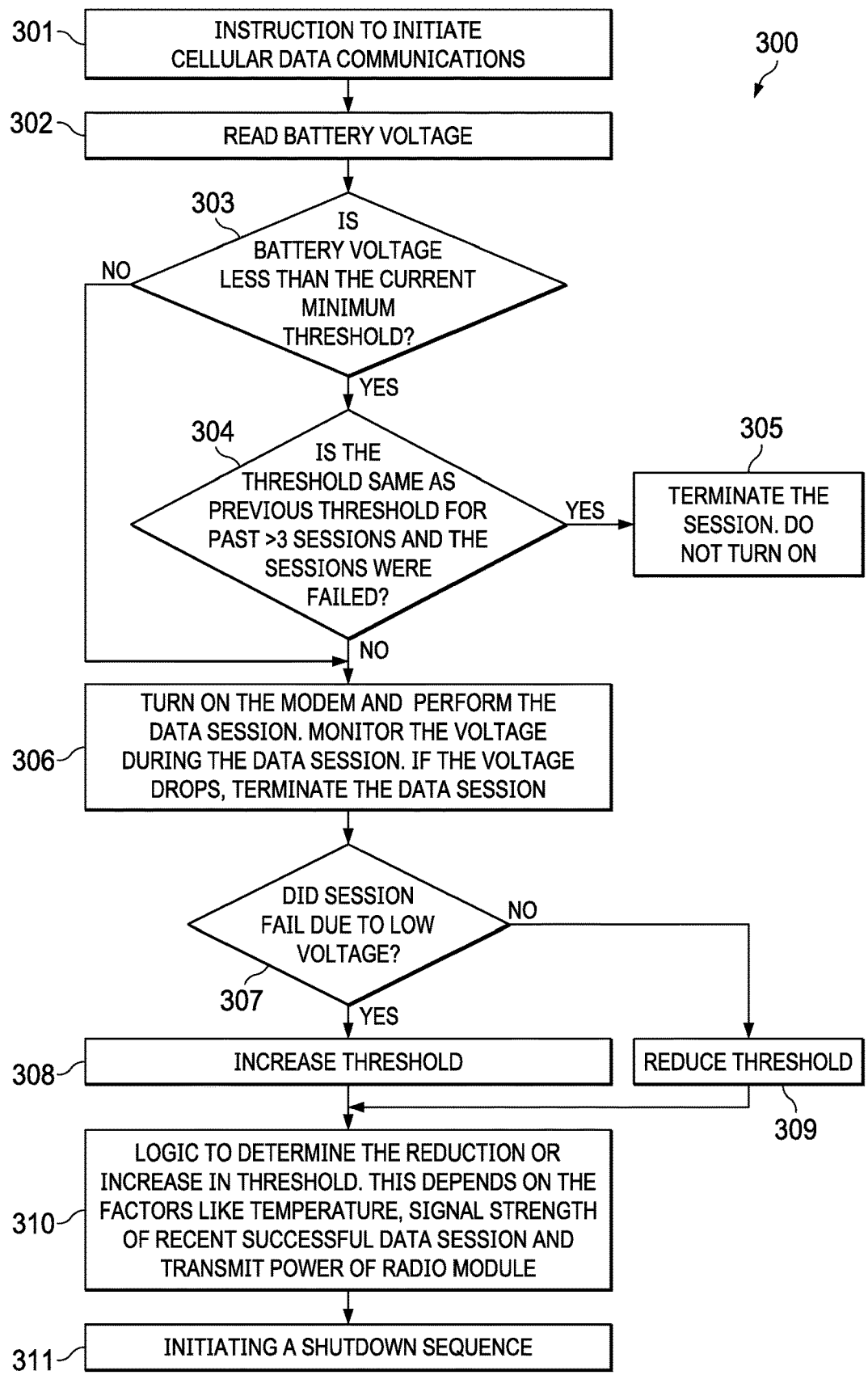
FIG. 3 is a flow chart that shows steps in a method of dynamic LBVT value setting for an industrial cellular modem, according to an example embodiment.

FIG. 3 is a flow chart that shows steps in a method 300 of dynamic LBVT value setting for reducing the power consumption of an industrial cellular modem having a battery, according to an example embodiment. The industrial cellular modem includes a radio module powered by a battery that is coupled to an antenna, the industrial cellular modem including a processor having a memory, a battery voltage sensor, a transmitted power meter, and a temperature sensor, such as the industrial cellular modem 100 shown in FIG. 1 described above. Step 301 comprises receiving an instruction to initiate cellular data communications. This instruction to initiate cellular communications is typically given by the connected sensor or data logger 230 shown in FIG. 2, shown in FIG. 2 received over a RS-232 cable. Step 302 comprises reading a current battery voltage of the battery 125.

Step 303 comprises comparing the current battery voltage to a CLBVT to determine whether or not the current battery voltage is greater than the CLBVT. If the current battery voltage is less than the CLBVT, the method reaches step 306. If the current battery voltage is greater than or equal to the CLBVT, the method reaches step 304. Step 304 comprises whether the battery voltage threshold is the same as the previous battery voltage threshold for at least three sessions where the sessions were determined to be failed. If the current battery voltage is greater than the CLBVT, the method reaches step 305 where the session is terminated and it is not attempted to turn on the industrial cellular modem. If the current battery voltage is not greater than the CLBVT, the method reaches step 306.

Step 306 comprises turning the industrial cellular modem on and beginning a current cellular data session with its host server. Following the completion of step 306, the method reaches step 307 which comprises checking whether the session failed due to low battery voltage. Step 308 or 309 is reached after the conclusion of step 307, with the CLBVT value being reduced in step 309 if the session did not fail due to low battery voltage, and the CLBVT value being increased in step 308 if the session failed due to low battery voltage.

In step 310, logic on the industrial cellular modem 100 based on results of step 308 or 309 determines the magnitude of the increase or decrease in the CLBVT value based on at least one parameter selected from a current temperature around the industrial cellular modem 100, a received signal strength for at least one recent successful data session with the host server, and a current transmit power of the radio module 105. The increase/decrease in the CLBVT value is generally in integer multiples (1, 2, 3 . . . ) of a voltage step size that may be 0.01 volts, or some other cellular modem factory configured voltage step value. An increase/decrease in the CLBVT value having a magnitude of multiple (e.g., 3) voltage step sizes (e.g., 0.03 V) may be used in the case the parameters used being selected from a current temperature around the industrial cellular modem 100, a received signal strength for at least one recent successful data session with the host server, and a current transmit power of the radio module 105, indicate the need for a voltage change that is larger than the voltage step size.

Step 311 comprises initiating a shutdown sequence. During the shutdown of the industrial cellular modem 100, the radio module 105 is turned off. Shutdown of the radio module 105 is employed as soon as it is detected that the communication session failed due to too low a current battery voltage. This is implemented because it is recognized if communications with the industrial cellular modem 100 are attempted or continued, the battery 125 may deplete towards zero volts causing the entire industrial cellular modem 100 to shut off While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

The invention claimed is:

1. A method of dynamic low battery voltage threshold control, comprising:

reading a current battery voltage across a battery of an industrial cellular modem having a radio module powered by the battery that is coupled to an antenna, the industrial cellular modem including a processor having an associated memory, a battery voltage sensor, a transmitted power meter, and a temperature sensor;

comparing the current battery voltage to a current low battery voltage threshold (CLBVT) to determine whether the current battery voltage is greater than the CLBVT;

turning the industrial cellular modem on and beginning a current cellular data session with a host server if the current battery voltage is greater than or equal to (>) the CLBVT, or the current battery voltage is less than (<) the CLBVT and a value of the CLBVT is a same as at least one previous cellular data session with the host server, and based on whether the current cellular data session failed due to the battery voltage falling below the CLBVT and whether the CLBVT is the same as the previous battery voltage threshold for at least three previous cellular data sessions where the sessions were determined to be failed, increasing or decreasing the value of the CLBVT based on at least one parameter selected from (i) a current temperature sensed by the temperature sensor, (ii) a received signal strength for at least one recent successful data session with the host server, and (iii) a current transmit power of the radio module from the transmitted power meter.

2. The method of claim 1, wherein the industrial cellular modem further comprises an explosion proof enclosure.

3. The method of claim 1, further comprising the industrial cellular modem initiating a cellular data session before the reading of the current battery voltage responsive to a scheduled pre-determined time or an alarm event at a wireless field device that the industrial cellular modem monitors.

4. The method of claim 1, wherein if the current battery voltage is less than the CLBVT, and the CLBVT has remained the same for the previous cellular data session, the industrial cellular modem is not turned on.

5. The method of claim 1, wherein the method is performed for a gas measurement application.

6. The method of claim 1, wherein the industrial cellular modem includes a sleep mode which is determined by a previous data call status, further comprising receiving a wakeup signal from an external source to wake up the industrial cellular modem from the sleep mode.

7. The method of claim 1, further comprising a Bluetooth low energy source configuring at least one operating parameter for the industrial cellular modem.

8. An industrial cellular modem, comprising:
a radio module powered by a battery coupled to an antenna,
a processor having an associated memory, a battery voltage sensor for sensing a voltage across terminals of the battery,
a transmitted power meter,
a temperature sensor,
the memory including program instructions executable by the processor for executing a method of dynamic low battery voltage threshold (LBVT) control, comprising:
reading a current battery voltage;
comparing the current battery voltage to a current LBVT (CLBVT) to determine whether the current battery voltage is greater than the CLBVT;
turning the industrial cellular modem on and beginning a current cellular data session with a host server if the current battery voltage is greater than or equal to (>) the CLBVT, or the current battery voltage is less than (<) the CLBVT and a value of the CLBVT is a same as at least one previous cellular data session with the host server; and
based on whether the current cellular data session failed due to the battery voltage falling below the CLBVT, and whether the CLBVT is the same as the previous battery voltage threshold for at least three previous cellular data sessions where the sessions were determined to be failed, increasing or decreasing the value of the CLBVT based on at least one parameter selected from (i) a current temperature sensed by the temperature sensor, (ii) a received signal strength for at least one recent successful data session with the host server, and (iii) a current transmit power of the radio module from the transmitted power meter.

9. The industrial cellular modem of claim 8, wherein the industrial cellular modem is exclusive of a keyboard, lacks a display screen, and lacks a rechargeable battery.

10. The industrial cellular modem of claim 8, wherein the industrial cellular modem further comprises an explosion proof enclosure.

11. The industrial cellular modem of claim 8, wherein the industrial cellular modem is configured for initiating a cellular data session before the reading of the current battery voltage responsive to a scheduled pre-determined time or an alarm event at a wireless field device that the industrial cellular modem monitors.

12. The industrial cellular modem of claim 8, wherein if the current battery voltage is less than the CLBVT, and the CLBVT has remained the same for the previous cellular data session, the industrial cellular modem is configured to not turned on.

13. The industrial cellular modem of claim 8, wherein the industrial cellular modem includes a sleep mode which is determined by a previous data call status, and is configured for receiving a wakeup signal from an external source to wake up the industrial cellular modem from the sleep mode.

14. The industrial cellular modem of claim 8, wherein the industrial cellular modem is configured for having at least one operating parameter being wirelessly programmed by Bluetooth low energy interface.

* * * * *